US009743556B1

(12) United States Patent
Yang

(10) Patent No.: US 9,743,556 B1
(45) Date of Patent: Aug. 22, 2017

(54) ELECTRICAL CONNECTOR STRUCTURE

(71) Applicant: ALL BEST PRECISION TECHNOLOGY CO., LTD., Taoyuan (TW)

(72) Inventor: Haven Yang, Taoyuan (TW)

(73) Assignee: ALL BEST PRECISION TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 15/273,723

(22) Filed: Sep. 23, 2016

(30) Foreign Application Priority Data

Jul. 21, 2016 (TW) ............................ 105210982 U

(51) Int. Cl.
*H05K 7/20* (2006.01)
*H01R 12/58* (2011.01)

(52) U.S. Cl.
CPC ....... *H05K 7/20409* (2013.01); *H01R 12/585* (2013.01)

(58) Field of Classification Search
CPC ........... H05K 7/20409; H05K 7/20418; G02B 6/4269
USPC ........................................................ 361/715
See application file for complete search history.

(56) References Cited

U.S. PATENT DOCUMENTS 7,539,018 B2 * 5/2009 Murr ................. H05K 7/20418 165/185

* cited by examiner

*Primary Examiner* — Ross Gushi
(74) *Attorney, Agent, or Firm* — Winston Hsu

(57) ABSTRACT

An electrical connector structure adapted for a plug module includes a housing, a heat dissipating component, and a restraining component. The housing includes a top wall whereon a top opening is formed. The heat dissipating component is disposed above the top opening. The restraining component includes a first restraining segment, a second restraining segment, a bending segment, a pressing portion, and an extending element. The pressing portion is connected to the second restraining segment. The bending segment is connected between the first restraining segment and the second restraining segment. The extending element is coupled to the housing, and the pressing portion is coupled to the heat dissipating component, so as to cooperatively fix the heat dissipating component above the top opening. Therefore, the heat dissipating component can be closely attached on the plug module inside the housing at all times to enhance heat dissipating efficiency.

19 Claims, 5 Drawing Sheets

ELECTRICAL CONNECTOR STRUCTURE

BACKGROUND OF THE INVENTION

1. Field of the Invention

The present invention relates to an electrical connector structure, and more particularly, to an electrical connector structure having a heat dissipating component and a restraining component with simple structure, easy assembly, and an enhanced holding effect.

2. Description of the Prior Art

With rapid development of electronic industries and communication equipment, there are more and more standards for electrical connectors released. The current trend is towards to high frequency transmission and lightweight design. However, in order to satisfy requirements of the high frequency transmission and the lightweight design, contacts and wires per unit area inside the electrical connector become more and more concentrated, which increases the generated heat sharply and raises an operational temperature inside of the electrical connector when the electrical connector is in operation. It affects operational function of the electrical connector when the operational temperature is over a normal range of a design temperature, which impacts on performance of the electrical connector.

To ensure the electrical connector to be operated within the normal range of the design temperature, a heat dissipating device is usually adapted to the electrical connector for increasing heat dissipating efficiency. For example, a heat sink with thermal fins is one of the most common heat dissipating devices. A base of the heat sink is fixed on a housing of the electrical connector and attached on a surface of a plug module inserting into the electrical connector, so that the generated heat can be transferred to the base and thermal fins of the heat sink quickly when the electrical connector is in operation, which improves the heat dissipating efficiency.

A conventional heat sink is usually fixed on two sides of the housing of the electrical connector by clamping members or fixing members. However, movement of the conventional heat sink relative to the housing cannot be restrained due to manufacturing tolerances of components of the electrical connector and the conventional heat sink, so that the base of the conventional heat sink cannot be closely attached on the plug module adapted for the electrical connector all the times, which reduces thermal conductivity between the heat sink and the plug module and reduces the heat dissipating efficiency.

SUMMARY OF THE INVENTION

Therefore, an objective of the present invention is to provide an electrical connector structure with simple structure and easy assembly. The electrical connector structure enhances heat dissipating efficiency for solving the aforementioned problem of that a conventional heat sink cannot be closely attached on a plug module.

In order to achieve the aforementioned objective, the present invention discloses an electrical connector structure adapted for a plug module. The electrical connector includes a housing, a heat dissipating component, and a restraining component. The housing includes a top wall. At least one top opening is formed on the top wall. The heat dissipating component is disposed above the at least one top opening. The restraining component includes a first restraining segment, at least one second restraining segment, at least one bending segment, at least one pressing portion, and at least one extending element. The at least one bending segment is connected between the first restraining segment and the at least one second restraining segment. The at least one pressing portion is connected to the at least one second restraining segment. The at least one extending element is coupled to the housing, and the at least one pressing portion is coupled to the heat dissipating component, so as to cooperatively fix the heat dissipating component above the at least one top opening.

According to an embodiment of the present invention, the first restraining segment is coupled to the top wall, and the at least one extending element extends from at least one lateral side of the first restraining segment and toward a rear side of the housing, so as to mechanically couple to the housing.

According to an embodiment of the present invention, the first restraining segment includes a plurality of extending elements extending from two lateral sides of the first restraining segment and toward the rear side of the housing, so as to mechanically couple to the housing.

According to an embodiment of the present invention, the at least one extending element includes a connecting portion and a stopping portion. At least one restraining slot is formed on the rear side of the housing. The connecting portion is connected to the at least one restraining slot, and the stopping portion contacts against an inner surface of a rear wall of the housing for restraining movement of the heat dissipating component.

According to an embodiment of the present invention, the at least one pressing portion extends from the at least one second restraining segment and toward a front side of the housing.

According to an embodiment of the present invention, the restraining component includes a plurality of second restraining segments and a plurality of pressing portions, and the plurality of pressing portions extends from the plurality of second restraining segments and toward the front side of the housing, respectively.

According to an embodiment of the present invention, the at least one bending segment is forced to be deformed for allowing the at least one second restraining segment to drive the at least one pressing portion to couple to the heat dissipating component.

According to an embodiment of the present invention, the top wall includes at least one first restraining arm disposed in front of the at least one top opening.

According to an embodiment of the present invention, the top wall further includes at least one second restraining arm disposed in rear of the at least one top opening and located between the heat dissipating component and the housing.

According to an embodiment of the present invention, the at least one first restraining arm, the at least one second restraining arm, and the at least one pressing portion cooperatively restrain movement of the heat dissipating component.

According to an embodiment of the present invention, the housing further includes at least one guiding track beside the at least one top opening and for guiding the heat dissipating component to a position corresponding to the at least one top opening.

In summary, the present invention utilizes the restraining component connected between the housing and the heat dissipating component of the electrical connector structure, so as to fix the heat dissipating component on the housing and restrain movement of the heat dissipating component relative to the housing, which provides an enhanced holding effect for keeping the heat dissipating component being closely attached on a plug module at all times. Therefore, the electrical connector structure of the present invention has an enhanced heat dissipating efficiency.

These and other objectives of the present invention will no doubt become obvious to those of ordinary skill in the art after reading the following detailed description of the preferred embodiment that is illustrated in the various figures and drawings.

DETAILED DESCRIPTION

In order to illustrate technical specifications and structural features as well as achieved purposes and effects of the present invention, relevant embodiments and figures are described as follows.

Figure 1:
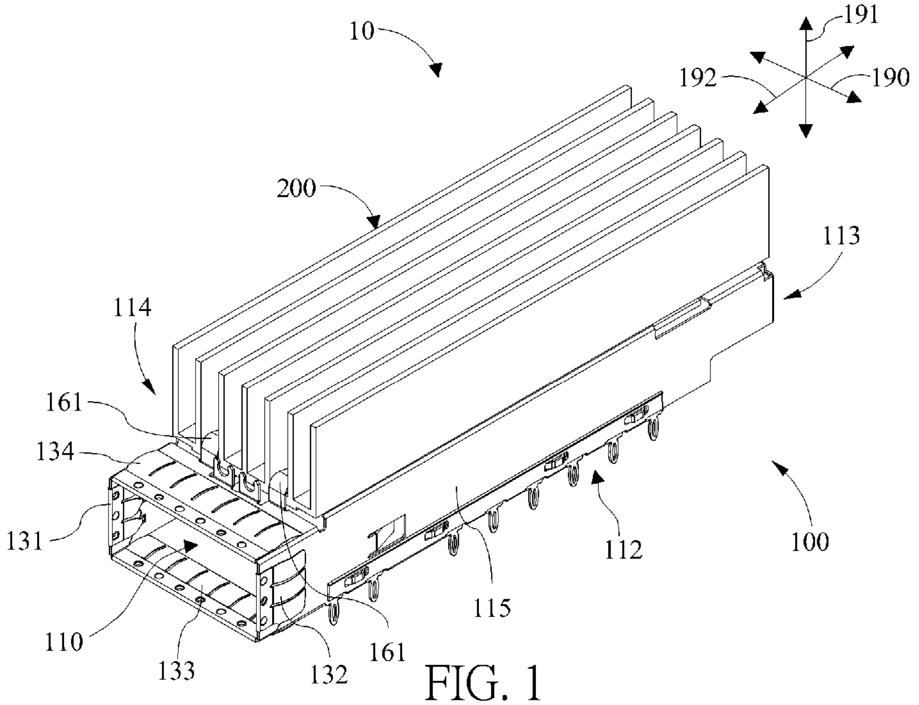
FIG. 1 is a schematic diagram of an electrical connector structure according to an embodiment of the present invention.
Figure 2:
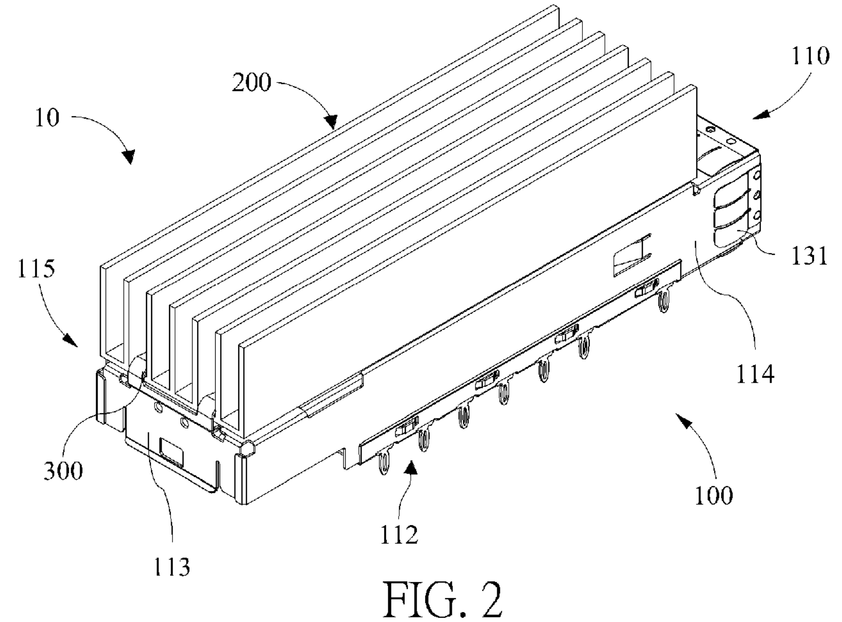
FIG. 2 is a schematic diagram of the electrical connector structure at another view according to the embodiment of the present invention.
Figure 3:
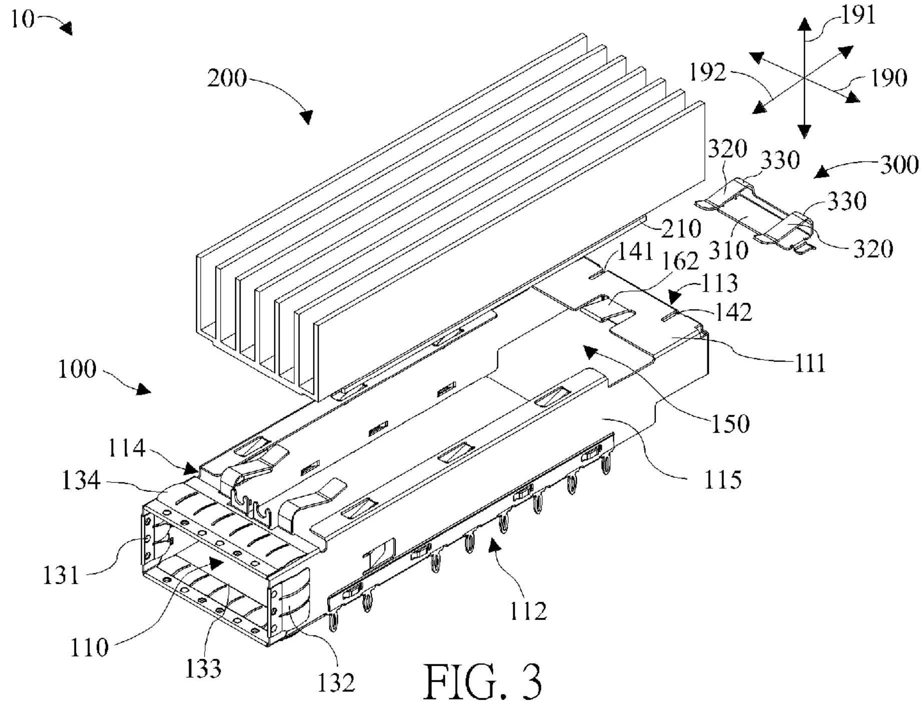
FIG. 3 is an exploded diagram of the electrical connector structure according to the embodiment of the present invention.

Please refer to FIG. 1 to FIG. 3. FIG. 1 is a schematic diagram of an electrical connector structure 10 according to an embodiment of the present invention. FIG. 2 is a schematic diagram of the electrical connector structure 10 at another view according to the embodiment of the present invention. FIG. 3 is an exploded diagram of the electrical connector structure 10 according to the embodiment of the present invention. As shown in FIG. 1 to FIG. 3, the electrical connector structure 10 is electrically disposed on a printed circuit board, which is not shown in figures, and adapted for a plug module, which is not shown in figures.

The electrical connector structure 10 includes a housing 100, a heat dissipating component 200, and a restraining component 300. The housing 100 mainly includes a top wall 111, a bottom wall 112, a rear wall 113, and two lateral walls 114, 115. The housing 100 is a hollow structure, and an accommodating space is formed among the top wall 111, the bottom wall 112, the rear wall 113, and the two lateral walls 114, 115 for receiving the plug module. The housing 100 has a front end and a rear end opposite to each other and arranged along a direction parallel to a longitudinal direction 192. The front end of the housing 100 has a port 110 and four shielding components 131, 132, 133, 134. The plug module passes through the port 110 to be received in the accommodating space of the housing 100. The four shielding components 131, 132, 133, 134 are disposed at positions adjacent to a periphery of the port 110. The two shielding components 131, 132 are arranged along a direction parallel to a vertical direction 191, and the other two shielding components 133, 134 are arranged along a direction parallel to a lateral direction 190, so as to reduce or prevent electromagnetic interference (EMI). However, the number and the configuration of the shielding component are not limited to those illustrated in figures in this embodiment. It depends on practical demands.

At least one top opening 150 is formed on the top wall 111 of the housing 100 for receiving the heat dissipating component 200. In this embodiment, there is one top opening 150 formed on the top wall 111. However, the number of the top opening 150 is not limited to this embodiment. Furthermore, as shown in FIG. 3 of this embodiment, the heat dissipating component 200 can be a heat sink with thermal fins but not limited thereto. The heat dissipating component 200 includes an engagement surface 210. A size and a shape of the engagement surface 210 are corresponding to ones of the top opening 150.

Figure 4:
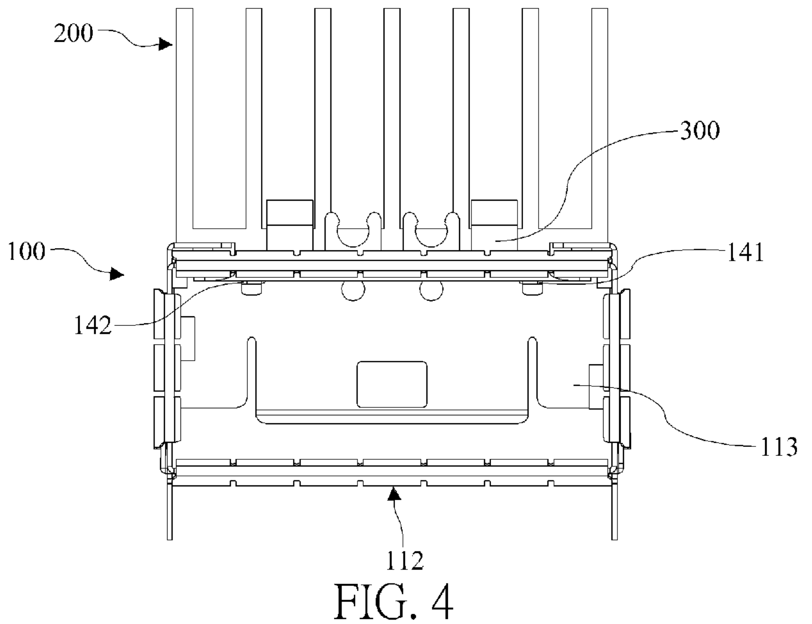
FIG. 4 is a rear view of the electrical connector structure according to the embodiment of the present invention.

Please refer to FIG. 4. FIG. 4 is a rearview of the electrical connector structure 10 according to the embodiment of the present invention. At least one restraining slot is formed on the top wall 111 and at a position where the top wall 111 is connected to the rear wall 113 for mechanically coupling to the restraining component 300. In this embodiment, there are two restraining slots 141, 142 formed on the top wall 111 and at positions where the top wall 111 is connected to the rear wall 113 for mechanically coupling to the restraining component 300. However, the number and the configuration of the restraining slot are not limited to those illustrated in figures in this embodiment. The restraining component 300 is coupled to the housing 100 and the heat dissipating component 200 for providing a holding effect therebetween, so that the engagement surface 210 can be closely attached on the plug module inside the housing 100.

Figure 5:
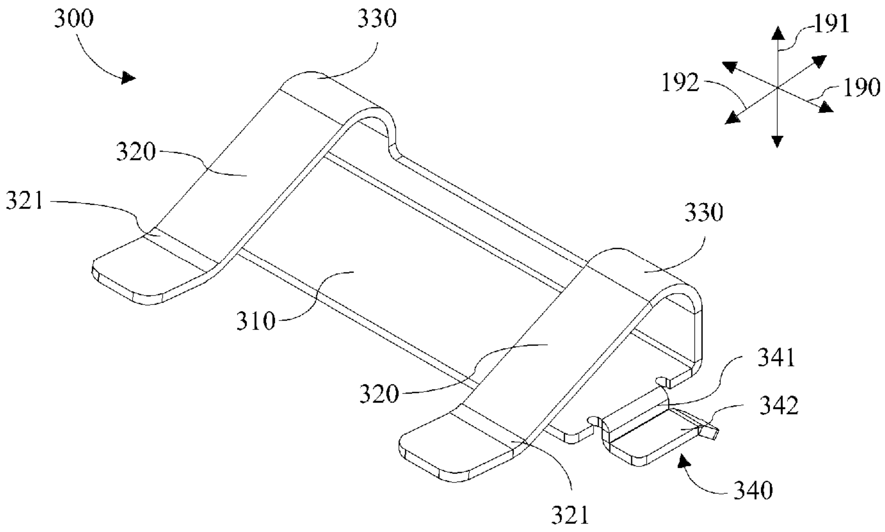
FIG. 5 is a diagram of a restraining component of the electrical connector structure according to the embodiment of the present invention.
Figure 6:
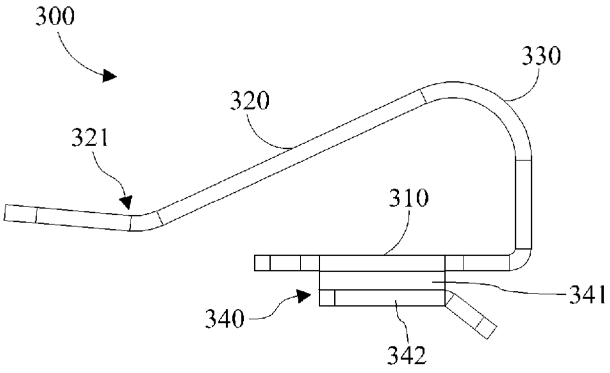
FIG. 6 is a lateral view of the restraining component of the electrical connector structure according to the embodiment of the present invention.

Please refer to FIG. 5 and FIG. 6. FIG. 5 is a diagram of the restraining component 300 of the electrical connector structure 10 according to the embodiment of the present invention. FIG. 6 is a lateral view of the restraining component 300 of the electrical connector structure 10 according to the embodiment of the present invention. The restraining component 300 includes a first restraining segment 310, at least one second restraining segment 320, at least one bending segment 330, at least one extending element 340, and at least one pressing portion 321. The at least one bending segment 330 is connected between the first restraining segment 310 and the at least one second restraining segment 320 for resilient deformation. The first restraining segment 310 can be a flat plate extending along the lateral direction 190. The at least one extending element 340 includes a connecting portion 341 and a stopping portion 342. The at least one extending element 340 extends from at least one lateral side of the first restraining segment 310 and toward a rear side of the housing 100. In this embodiment, the at least one second restraining segment 320 can be a cantilever spring having a front end and a rear end opposite to each other. The rear end of the at least one second restraining segment 320 is connected to the at least one bending segment 330. The front end of the at least one second restraining segment 320 extends forwardly along the longitudinal direction 192 to connect the at least one pressing portion 321. The first restraining segment 310 contacts with the top wall 111. The at least one extending element 340 is mechanically coupled to the housing 100. The at least one pressing portion 321 presses the heat dissipating component 200 downwardly. Therefore, the heat dissipating component 200 is fixed above the top opening 150, so that movement of the heat dissipating component 200 relative to the housing 100 along the vertical direction 191 is restrained.

In this embodiment, the restraining component 300 includes the two second restraining segments 320, the two bending segments 330, the two pressing portions 321, and the two extending elements 340. When the first restraining segment 310 includes a plurality of extending elements 340, the plurality of extending elements 340 extends from two lateral sides of the first restraining segment 310 and toward the rear side of the housing 100 respectively, so as to mechanically couple to the housing 100.

Furthermore, when the restraining component 300 includes a plurality of second restraining segments 320, a plurality of bending segments 330 and a plurality of pressing portions 321, the plurality of pressing portions 321 respectively extends from the plurality of second restraining segments 320 and toward a front side of the housing 100. The plurality of bending segments 330 is connected between the first restraining segment 310 and the plurality of second restraining segments 320 for resilient deformation to allow the plurality of second restraining segments 320 to drive the two pressing portions 321 to couple with the heat dissipating component 200, and the plurality of pressing portions 321 presses the heat dissipating component 200 downwardly, so that the heat dissipating component 200 is fixed above the top opening 150 and movement of the heat dissipating component 200 along the vertical direction 191 is restrained. However, the numbers and the configurations of the second restraining segment 320, the bending segment 330, the pressing portion 321, and the extending element 340 are not limited to this embodiment. It depends on practical demands.

Figure 7:
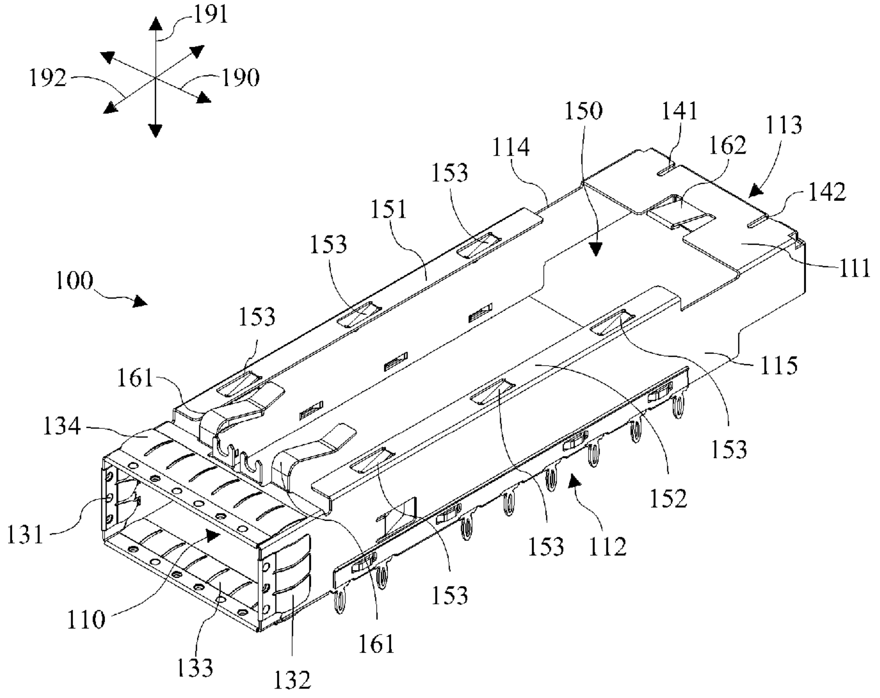
FIG. 7 is a diagram of a housing of the electrical connector structure according to the embodiment of the present invention.

Please refer to FIG. 7. FIG. 7 is a diagram of the housing 100 of the electrical connector structure 10 according to the embodiment of the present invention. In order to improve a guiding effect and the holding effect, the housing 100 further includes two guiding tracks 151, 152 located beside the top opening 150 and for guiding the heat dissipating component 200 to a position corresponding to the top opening 150. The two guiding tracks 151, 152 are connected to the two lateral walls 114, 115, respectively and extend along a direction parallel to the longitudinal direction 192. Each of the two guiding tracks 151, 152 includes at least one guiding element 153. The at least one guiding element 153 can be a cantilever spring but not limited thereto. When the heat dissipating component 200 is guided to the position corresponding to the top opening 150 by the two guiding tracks 151, 152, the at least one guiding element 153 presses the heat dissipating component 200 downwardly for restraining the movement of the heat dissipating component 200 along the vertical direction 191. In this embodiment, each of the two guiding tracks 151, 152 includes three guiding elements 153. However, the number and the configuration of the guiding element 153 are not limited to this embodiment.

Furthermore, the top wall 111 of the housing 100 further includes at least one first restraining arm 161 and at least one second restraining arm 162. The at least one first restraining arm 161 is disposed adjacent the port 110, i.e., the at least one first restraining arm 161 is disposed in front of the top opening 150. The at least one first restraining arm 161 has a front end and a rear end opposite to each other. The front end of the at least one first restraining arm 161 is connected to the top wall 111, and the rear end of the at least one first restraining arm 161 extends rearwardly along the longitudinal direction 192. The second restraining arm 162 is disposed adjacent the rear wall 113, i.e., the second restraining arm 162 is disposed in rear of the top opening 150. The second restraining arm 162 has a front end and a rear end opposite to each other. The rear end of the second restraining arm 162 is connected to the top wall 111, and the front end of the second restraining arm 162 extends forwardly along the longitudinal direction 192. In this embodiment, the top wall 111 includes two first restraining arms 161 and one second restraining arm 162. However, the numbers and the configurations of the first restraining arm 161 and the second restraining arm 162 are not limited to those illustrated in figures in this embodiment. It depends on practical demands.

Figure 8:
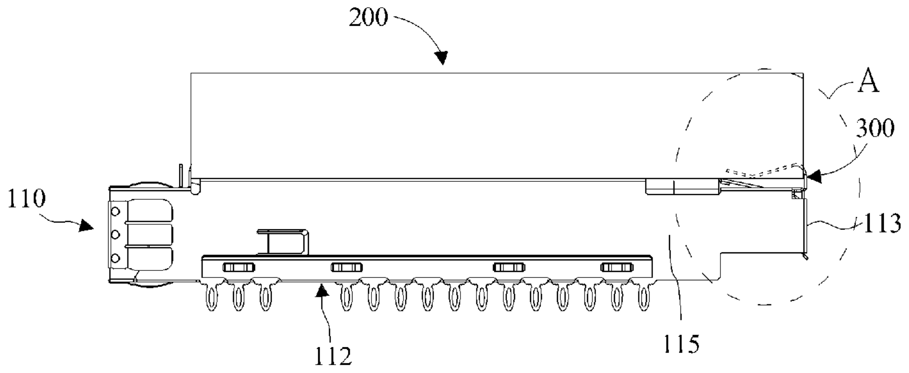
FIG. 8 is a lateral view of the electrical connector structure according to the embodiment of the present invention.
Figure 9:
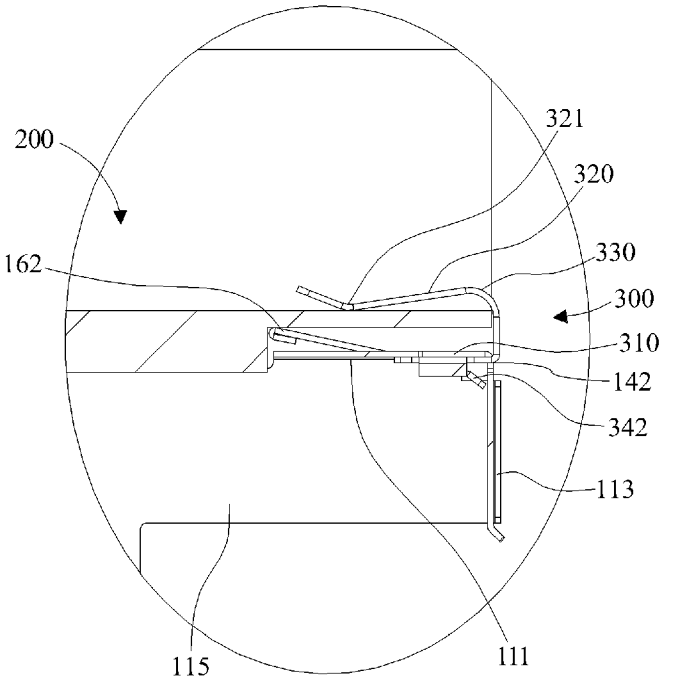
FIG. 9 is an enlarged sectional diagram of an A portion of the electrical connector structure shown in FIG. 8 according to the embodiment of the present invention.

Please refer to FIG. 8 and FIG. 9. FIG. 8 is a lateral view of the electrical connector structure 10 according to the embodiment of the present invention. FIG. 9 is an enlarged sectional diagram of an A portion of the electrical connector structure 10 shown in FIG. 8 according to the embodiment of the present invention. Operational principle of the electrical connector structure 10 of the present invention is introduced as follows. For coupling the heat dissipating component 200 and the housing 100 by the restraining component 300, the restraining component 300 is to be assembled from the rear side of the housing 100. The two extending elements 340 located at two lateral sides of the first restraining segment 310 are connected to the two restraining slots 141, 142, respectively. At this time, the first restraining segment 310 contacts with the top wall 111. Parts of the two connecting portions 341 contact with the top wall 111. The two stopping portions 342 contact against an inner surface of the rear wall 113. The two restraining segments 320 drive the two pressing portions 321 to contact with the heat dissipating component 200. Therefore, movements of the heat dissipating component 200 along the vertical direction 191 and the longitudinal direction 192 are restrained accordingly.

Furthermore, the two first restraining arms 161 and the two pressing portions 321 contact with the heat dissipating component 200 cooperatively for providing the enhanced holding effect downwardly to fix the heat dissipating component 200 at the position corresponding to the top opening 150, so that the engagement surface 210 can be closely attached on the plug module, which improves the holding effect.

Besides, when the heat dissipating component 200 is fixed on the housing 100 by the restraining component 300, the second restraining arm 162 is located between the heat dissipating component 200 and the housing 100 for providing a buffering effect upwardly against the downward holding effect provided by the two pressing portions 321, which prevents a front end of the heat dissipating component 200 from being pried relative to the housing 100 by the two pressing portions 321. Therefore, it solves a problem of poor heat dissipating efficiency caused by incomplete attachment of the heat dissipating component and the plug module.

Moreover, when the heat dissipating component 200 is fixed on the housing 100 by the restraining component 300, the two first restraining arms 161, the second restraining arm 162 and the two pressing portions 321 are coupled to the heat dissipating component 200 for cooperatively fixing the heat dissipating component 200 at the position corresponding to the top opening 150, so as to restrain the movements of the heat dissipating component 200 along the vertical direction 191 and the longitudinal direction 192, so that the engagement surface 210 can be attached on the plug module closely at all times, which enhances thermal conductivity between the plug module and the heat dissipating component 200 and improves the heat dissipating efficiency.

In contrast to the prior art, the electrical connector structure of the present invention utilizes the restraining component mechanically coupled between the heat dissipating component and the housing for solving a problem of the poor heat dissipating efficiency caused by incomplete attachment of a conventional heat sink and a plug module. Furthermore, the restraining component of the electrical connector structure of the present invention has advantages of simple structure and easy assembly. Besides, a position of the heat dissipating component 200 relative to the top opening 150 is fixed at all times and is not affected by insertion and pulling out of the plug module, which improves a positioning effect and the holding effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical connector structure comprising:

a housing comprising a top wall, at least one top opening being formed on the top wall;

a heat dissipating component disposed above the at least one top opening; and a restraining component comprising a first restraining segment, at least one second restraining segment, at least one bending segment, at least one pressing portion and at least one extending element, the first restraining segment being coupled to the top wall, the at least one bending segment being connected between the first restraining segment and the at least one second restraining segment, the at least one pressing portion being connected to the at least one second restraining segment, the at least one extending element extending from at least one lateral side of the first restraining segment and toward a rear side of the housing, so as to mechanically couple to the housing, and the at least one pressing portion being coupled to the heat dissipating component, so as to cooperatively fix the heat dissipating component above the at least one top opening.

2. The electrical connector structure of claim 1, wherein the first restraining segment comprises a plurality of extending elements extending from two lateral sides of the first restraining segment and toward the rear side of the housing, so as to mechanically couple to the housing.

3. The electrical connector structure of claim 1, wherein the at least one extending element comprises a connecting portion and a stopping portion, at least one restraining slot is formed on the rear side of the housing, the connecting portion is connected to the at least one restraining slot, and the stopping portion contacts against an inner surface of a rear wall of the housing for restraining movement of the heat dissipating component.

4. The electrical connector structure of claim 1, wherein the at least one pressing portion extends from the at least one second restraining segment and toward a front side of the housing.

5. The electrical connector structure of claim 4, wherein the restraining component comprises a plurality of second restraining segments and a plurality of pressing portions, and the plurality of pressing portions extends from the plurality of second restraining segments and toward the front side of the housing, respectively.

6. The electrical connector structure of claim 1, wherein the at least one bending segment is forced to be deformed for allowing the at least one second restraining segment to drive the at least one pressing portion to couple to the heat dissipating component.

7. The electrical connector structure of claim 1, wherein the top wall comprises at least one first restraining arm disposed in front of the at least one top opening.

8. The electrical connector structure of claim 7, wherein the top wall further comprises at least one second restraining arm disposed in rear of the at least one top opening and located between the heat dissipating component and the housing.

9. The electrical connector structure of claim 8, wherein the at least one first restraining arm, the at least one second restraining arm and the at least one pressing portion cooperatively restrain movement of the heat dissipating component.

10. The electrical connector structure of claim 1, wherein the housing further comprises at least one guiding track beside the at least one top opening and for guiding the heat dissipating component to a position corresponding to the at least one top opening.

11. An electrical connector structure comprising:

a housing comprising a top wall, at least one top opening being formed on the top wall, and the top wall comprising at least one first restraining arm disposed in front of the at least one top opening;

a heat dissipating component disposed above the at least one top opening; and a restraining component comprising a first restraining segment, at least one second restraining segment, at least one bending segment, at least one pressing portion and at least one extending element, the at least one bending segment being connected between the first restraining segment and the at least one second restraining segment, the at least one pressing portion being connected to the at least one second restraining segment, the at least one extending element being coupled to the housing, and the at least one pressing portion being coupled to the heat dissipating component, so as to cooperatively fix the heat dissipating component above the at least one top opening.

12. The electrical connector structure of claim 11, wherein the first restraining segment is coupled to the top wall, and the first restraining segment comprises a plurality of extending elements extending from two lateral sides of the first restraining segment and toward the rear side of the housing, so as to mechanically couple to the housing.

13. The electrical connector structure of claim 11, wherein the first restraining segment is coupled to the top wall, the at least one extending element extends from at least one lateral side of the first restraining segment and toward a rear side of the housing, so as to mechanically couple to the housing, the at least one extending element comprises a connecting portion and a stopping portion, at least one restraining slot is formed on the rear side of the housing, the connecting portion is connected to the at least one restraining slot, and the stopping portion contacts against an inner surface of a rear wall of the housing for restraining movement of the heat dissipating component.

14. The electrical connector structure of claim 11, wherein the at least one pressing portion extends from the at least one second restraining segment and toward a front side of the housing.

15. The electrical connector structure of claim 14, wherein the restraining component comprises a plurality of second restraining segments and a plurality of pressing portions, and the plurality of pressing portions extends from the plurality of second restraining segments and toward the front side of the housing, respectively.

16. The electrical connector structure of claim 11, wherein the at least one bending segment is forced to be deformed for allowing the at least one second restraining segment to drive the at least one pressing portion to couple to the heat dissipating component.

17. The electrical connector structure of claim 11, wherein the top wall further comprises at least one second restraining arm disposed in rear of the at least one top opening and located between the heat dissipating component and the housing.

18. The electrical connector structure of claim 17, wherein the at least one first restraining arm, the at least one second restraining arm and the at least one pressing portion cooperatively restrain movement of the heat dissipating component.

19. The electrical connector structure of claim 11, wherein the housing further comprises at least one guiding track beside the at least one top opening and for guiding the heat dissipating component to a position corresponding to the at least one top opening.

* * * * *